United States Patent
Chen

(10) Patent No.: US 10,079,698 B1
(45) Date of Patent: Sep. 18, 2018

(54) APPARATUS AND METHOD FOR CALIBRATING A RECEIVER WITH A DECISION FEEDBACK EQUALIZER (DFE)

(71) Applicant: QUALCOMM Incorporated, San Diego, CA (US)

(72) Inventor: Minhan Chen, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/654,540

(22) Filed: Jul. 19, 2017

Related U.S. Application Data

(60) Provisional application No. 62/512,837, filed on May 31, 2017.

(51) Int. Cl.
*H04L 25/03* (2006.01)
*H04L 1/00* (2006.01)

(52) U.S. Cl.
CPC ...... *H04L 25/03267* (2013.01); *H04L 1/0071* (2013.01); *H04L 2025/0349* (2013.01); *H04L 2025/03617* (2013.01)

(58) Field of Classification Search
CPC ............. H04L 25/03267; H04L 1/0071; H04L 2025/0349; H04L 2025/03617
See application file for complete search history.

(56) References Cited

U.S. PATENT DOCUMENTS

| | | | | |
|---|---|---|---|---|
| 7,321,259 B1 * | 1/2008 | Shumarayev | ....... | H03F 3/45183 327/307 |
| 8,385,496 B1 * | 2/2013 | Chan | ........... | H04L 7/033 327/307 |
| 8,401,064 B1 * | 3/2013 | Lin | ............. | H04L 25/03267 375/229 |
| 9,025,654 B1 | 5/2015 | Su et al. | | |
| 9,385,695 B2 | 7/2016 | Chen et al. | | |
| 9,444,657 B2 | 9/2016 | Chen et al. | | |
| 9,515,856 B2 | 12/2016 | Kaviani et al. | | |
| 9,571,115 B1 * | 2/2017 | Beukema | ........... | H03M 1/1023 |
| 2009/0131006 A1 | 5/2009 | Wu | | |
| 2009/0146722 A1 * | 6/2009 | Chen | ............. | H03F 3/45183 327/307 |
| 2010/0046683 A1 * | 2/2010 | Beukema | ............. | H04L 7/0062 375/355 |
| 2012/0086494 A1 * | 4/2012 | Asada | ............. | H03L 7/0807 327/307 |
| 2012/0106687 A1 | 5/2012 | Bulzacchelli et al. | | |
| 2015/0358005 A1 * | 12/2015 | Chen | ............. | H03K 5/003 375/233 |

* cited by examiner

*Primary Examiner* — Kenneth Lam
(74) *Attorney, Agent, or Firm* — Loza & Loza, LLP/Qualcomm

(57) ABSTRACT

Aspects of the disclosure are directed to determining an offset calibration step size of a sample latch. In accordance with one aspect, the disclosure relate to a Decision Feedback Equalizer (DFE) input section including a E sample latch to output a target signal sample; a E sample digital to analog converter coupled to the E sample latch to input a target voltage to the E sample latch; a sample latch to output a signal sample; and a voltage digital to analog converter coupled to the E sample latch and the sample latch to generate a bias voltage, wherein the bias voltage is inputted to the E sample latch and the sample latch. The DFE input section may further include a latch offset decoder to scale the bias voltage and a summing amplifier to receive an analog input waveform to the DFE input section.

30 Claims, 9 Drawing Sheets

APPARATUS AND METHOD FOR CALIBRATING A RECEIVER WITH A DECISION FEEDBACK EQUALIZER (DFE)

PRIORITY CLAIM

This application claims priority to and the benefit of provisional patent application No. 62/512,837 filed in the United States Patent and Trademark Office on May 31, 2017, the entire content of which is incorporated herein by reference as if fully set forth below in its entirety and for all applicable purposes.

TECHNICAL FIELD

This disclosure relates generally to the field of calibrating a receiver, and, in particular, to calibrating a receiver with a Decision Feedback Equalizer (DFE).

BACKGROUND

A high-performance Decision Feedback Equalizer (DFE) in a receiver employs high precision sample latches to capture and quantize an incoming high-speed signal. DFE performance depends on the sample latch accuracy, for example, the sample latch voltage offset. To mitigate DFE performance degradation, sample latch voltage offset must be calibrated. However, voltage offset calibration in conventional designs are limited by the precision of relative geometric dimensions of the underlying transistors. As a result, voltage offset calibration may have a restricted offset calibration range if the offset calibration step size is too small, or voltage offset calibration may have poor calibration precision if the offset calibration step size is too large. That is, the precision of relative transistor dimensions affects voltage offset calibration accuracy. And, in turn, the voltage offset calibration accuracy affects DFE performance.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In one aspect, the disclosure provides determining an offset calibration step size of a sample latch. Accordingly, a method for determining an offset calibration step size of a sample latch including generating a first target voltage; setting a calibration digital control word; and adjusting a quantization digital control word based on the first target voltage and the calibration digital control word to a first integral value, wherein the first integral value is based on the sample latch reaching a first metastable state. The method further includes determining a first step size, wherein the first step size is a value of an offset calibration step size which corresponds to the first integral value. The method may further include generating a second target voltage; resetting the calibration digital control word to generate a reset calibration digital control word; and readjusting the quantization digital control word based on the second target voltage and the reset calibration digital control word to a second integral value. The method may further include determining a second step size, wherein the second step size is a value of the offset calibration step size which corresponds to the second integral value. The method may further include determining a calibrated quantization digital control word, wherein the calibrated quantization digital control word is an arithmetic average of the first integral value and the second integral value. The method may further include determining a calibrated offset calibration step size, wherein the calibrated offset calibration step size is an arithmetic average of the first step size and the second step size. In one example, the second integral value is based on the sample latch reaching a second metastable state. In one example, the second metastable state is different from the first metastable state. In one example, the generating the first target voltage step includes setting a E sample digital control word to a first target code with a E sample sign bit set to a first polarity. In one example, first target voltage equals a product of the first target code and a EDAC output resolution.

Another aspect of the disclosure provides a Decision Feedback Equalizer (DFE) input section including a E sample latch to output a target signal sample; a E sample digital to analog converter coupled to the E sample latch to input a target voltage to the E sample latch; a sample latch to output a signal sample; and a voltage digital to analog converter coupled to the E sample latch and the sample latch to generate a bias voltage, wherein the bias voltage is inputted to the E sample latch and the sample latch. The Decision Feedback Equalizer input section may further include a latch offset decoder to scale the bias voltage. The Decision Feedback Equalizer input section may also further include a summing amplifier to receive an analog input waveform to the DFE input section. In one example, the signal sample and the target signal sample are compared to determine if a metastable state is reached by the sample latch. The Decision Feedback Equalizer input section may further include a Eb sample latch to output a complementary target signal sample. In one example, the sample latch comprises a plurality of sample latches, and wherein the signal sample comprises at least an inphase signal sample and a quadrature signal sample. In one example, the plurality of sample latches further outputs at least a complementary inphase signal sample and a complementary quadrature signal sample. In one example, a first combination of the target signal sample and the complementary target signal sample is compared with a second combination of the at least the inphase signal sample and the quadrature signal sample and the at least the complementary inphase signal sample and the complementary quadrature signal sample to determine if a metastable state is reached by the sample latch.

Another aspect of the disclosure provides a Decision Feedback Equalizer (DFE) input section including means for outputting a target signal sample; means for inputting a target voltage to the means for outputting the target signal sample; means for outputting a signal sample; and means for generating a bias voltage, wherein the bias voltage (VB) is inputted to the means for outputting the target signal sample and the means for outputting the signal sample. The Decision Feedback Equalizer input section may further include means for scaling the bias voltage and means for receiving an analog input waveform to the DFE input section.

Another aspect of the disclosure provides a computer-readable medium storing computer executable code, operable on a device including at least one processor and at least one memory coupled to the at least one processor, wherein the at least one processor is configured to implement determining an offset calibration step size of a sample latch, the computer executable code including instructions for causing a computer to generate a first target voltage; instructions for causing the computer to set a calibration digital control word; and instructions for causing the computer to adjust a quantization digital control word based on the first target voltage and the calibration digital control word to a first integral value, wherein the first integral value is based on the sample latch reaching a first metastable state. The computer-readable medium may further include instructions for causing the computer to determine a first step size, wherein the first step size is a value of an offset calibration step size which corresponds to the first integral value; instructions for causing the computer to generate a second target voltage; instructions for causing the computer to reset the calibration digital control word to generate a reset calibration digital control word; instructions for causing the computer to readjust the quantization digital control word based on the second target voltage and the reset calibration digital control word to a second integral value; instructions for causing the computer to determine a second step size, wherein the second step size is a value of the offset calibration step size which corresponds to the second integral value; instructions for causing the computer to determine a calibrated quantization digital control word, wherein the calibrated quantization digital control word is an arithmetic average of the first integral value and the second integral value; instructions for causing the computer to determine a calibrated offset calibration step size, wherein the calibrated offset calibration step size is an arithmetic average of the first step size and the second step size. In one example, the second integral value is based on the sample latch reaching a second metastable state, and wherein the second metastable state is different from the first metastable state. In one example, the instructions for causing the computer to generate the first target voltage include instructions for causing the computer to set a E sample digital control word to a first target code with a E sample sign bit set to a first polarity. In one example, the first target voltage equals a product of the first target code and a EDAC output resolution.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

DETAILED DESCRIPTION

Figure 1:
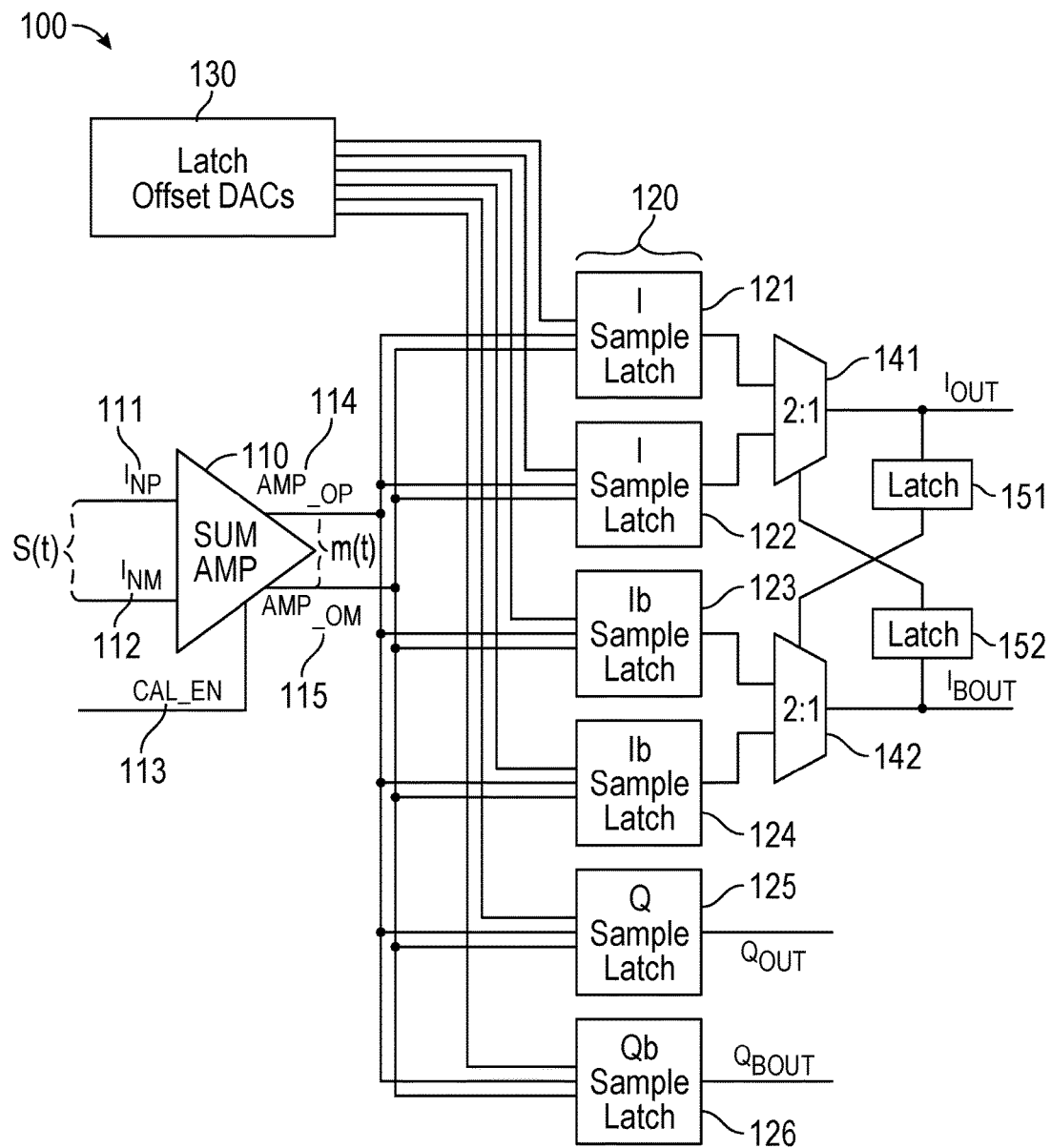
FIG. 1 illustrates a first example of a Decision Feedback Equalizer (DFE) input section.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

For a high speed serial digital communication system which transports a series of data symbols over time from a transmitter to a receiver, the data symbol integrity may be degraded by the transfer function of the channel. In general, the channel is the medium between the transmitter and receiver. The transfer function describes the response of the channel in the frequency domain; that is, filtering properties over frequency. For example, an ideal transfer function has a uniform amplitude response vs. frequency and a linear phase response vs. frequency. The ideal transfer function characteristics provide a distortionless transport of data symbols. For example, a non-ideal transfer function may be a non-uniform amplitude response vs. frequency and a nonlinear phase response vs. frequency. The non-ideal transfer function characteristics produce distorted data symbols at the receiver.

A form of distorted data symbols may be caused by intersymbol interference (ISI) due to the non-ideal transfer function of the channel. ISI is a type of symbol interference to a given symbol from adjacent symbols which results in bit error rate (BER) degradation. One measure of ISI is the degree of data eye closure in an eye diagram of the receiver input. In this context, a data eye is a graphical representation of overlaid versions of consecutive data symbols on the same time scale, for example, from an oscilloscope display. The degree of data eye closure in the eye diagram corresponds to the amount of ISI present in the receiver input.

That is, a wide data eye implies little or no ISI, while a narrow or closed data eye implies significant ISI, and thus, significant distortion.

One mitigation technique against ISI is to use an equalizer in the receiver to compensate for the non-ideal transfer function of the channel, that is, to enhance an opening of the data eye in the eye diagram. Different types of equalizers may be used. One particular form of equalizer is known as a Decision Feedback Equalizer (DFE) where a plurality of weighted delay line outputs is combined to provide an improved receiver response. The weights may be determined by bit decisions at the receiver output which are fed back to the receiver input. A high-performance Decision Feedback Equalizer (DFE) in a receiver may employ high precision sample latches to capture and quantize an incoming high-speed signal. DFE performance then depends on the sample latch accuracy, for example, sample latch voltage offset and sample latch quantization step size. To mitigate DFE performance degradation, sample latch voltage offset and quantization step size need to be calibrated. However, accurate calibration may be limited by the precision of relative geometric dimensions of the underlying transistors. For example, voltage offset calibration may have a restricted offset calibration range if the offset calibration step size is too small, or voltage offset calibration may have poor calibration precision if the offset calibration step size is too large.

That is, the precision of relative transistor dimensions may affect DFE calibration accuracy. And, in turn, the DFE calibration accuracy may affect DFE performance. Thus, improving DFE calibration accuracy may lead to improving DFE performance in a receiver. In one example, a receiver with a Decision Feedback Equalizer (DFE) may have a plurality of high speed receiving paths each with high precision sample latches. For example, a sample latch may be used to sample an incoming signal in time to produce a signal sample and then to decide if the signal sample represents a 0 or a 1 (i.e., make a hard decision on the signal sample).

FIG. 1 illustrates a first example of a Decision Feedback Equalizer (DFE) input section 100. The DFE input section 100 is coupled to other parts of the DFE (not shown) including tapped delay lines with adaptive weights. In one example, the DFE input section 100 accepts an analog input waveform S(t) as a function of time and produces ½ rate even and odd inphase signal samples, Iout and Ibout, and ½ rate even and odd quadrature signal samples, Qout and Qbout. The inphase and quadrature signal samples are digital representations of the analog input waveform S(t). In one example, the plurality of signal samples ($I_{out}$, $Q_{out}$, $I_{bout}$, $Q_{bout}$) are used to control the DFE adaptive weights.

Shown in FIG. 1 is a summing amplifier 110 which accepts the analog input waveform S(t) across its differential input terminals $I_{np}$ 111 and $I_{nm}$ 112 and which produces an amplified input waveform m(t) across its differential output terminals AMP_$_{OP}$ 114 and AMP_$_{OM}$ 115. In addition, a calibration enable signal CAL_EN 113 is fed to the summing amplifier 110 to enable or disable a calibration mode. The differential output terminals are each connected as a set of first and second inputs to a set of parallel sample latches 120. Shown as an example in FIG. 1 is a set of parallel sample latches 120 which includes a first I sample latch 121, a second I sample latch 122, a first Ib sample latch 123, a second Ib sample latch 124, a Q sample latch 125 and a Qb sample latch 126. Also shown is a set of latch offset digital to analog converters (DACs) 130 which may provide a set of third inputs to the set of parallel sample latches 120. In one example, the set of third inputs may provide a plurality voltage calibration offsets to the set of parallel sample latches 120 to compensate their sample latch voltage offsets.

The inphase signal samples $I_{out}$ may be generated by selecting outputs of the first I sample latch 121 and the second I sample latch 122 using a first multiplexer 141. The complementary inphase signal samples $I_{bout}$ may be generated by selecting outputs of the first Ib sample latch 123 and the second Ib sample latch 124 using a second multiplexer 142. In one example, the selection of the first multiplexer 141 output may be governed by a latched version of the complementary inphase signal samples $I_{bout}$ produced by a second latch 152. In one example, the selection of the second multiplexer output may be governed by a latched version of the inphase signal samples $I_{out}$ produced by a first latch 151. The quadrature signal samples $Q_{out}$ may be generated by the output of the Q sample latch 125. The complementary quadrature signal samples $Q_{bout}$ may be generated by the output of the Qb sample latch 126. In one aspect, the sample latch voltage offsets in the set of parallel sample latches 120 may have different magnitudes. Therefore, each sample latch voltage offset need to be calibrated and compensated individually to enhance the opening of the data eye for each receiving path.

Figure 2:
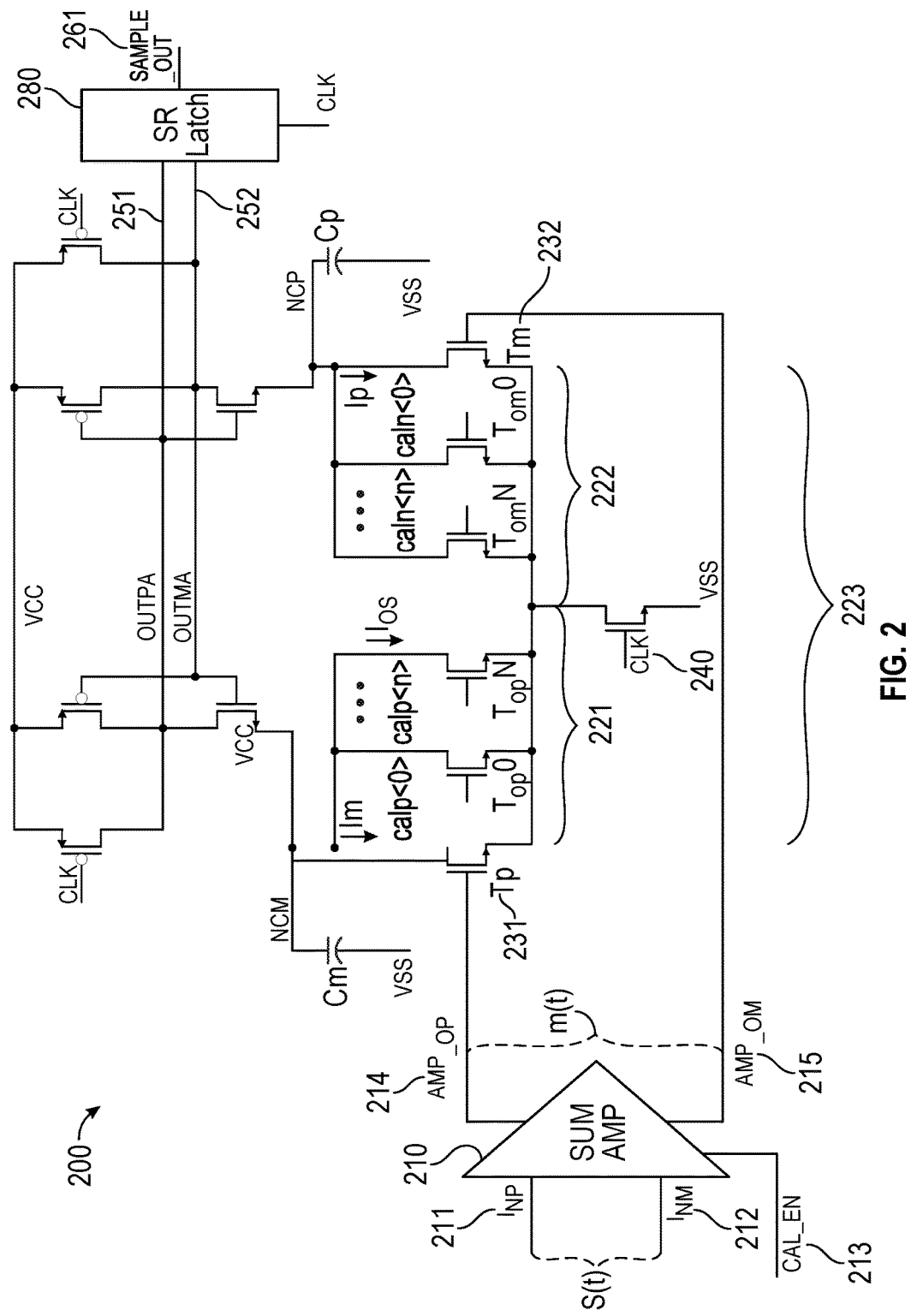
FIG. 2 illustrates a first example of an implementation of the Decision Feedback Equalizer (DFE) input section of FIG. 1.

FIG. 2 illustrates a first example of an implementation 200 of the Decision Feedback Equalizer (DFE) input section 100 of FIG. 1. The DFE input section 100 includes a summing amplifier (SUM AMP) 210 which accepts the analog input waveform S(t) across its differential input terminals $I_{np}$ 211 and $I_{nm}$ 212 and which produces an amplified input waveform m(t) across its first differential output terminal AMP_$_{OP}$ 214 and second differential output terminal AMP_$_{OM}$ 215. In addition, a calibration enable signal CAL_EN 213 is fed to the summing amplifier 210 to enable or disable a calibration mode. The first differential output terminal AMP_$_{OP}$ 214 is connected as input to a plus latch half 221. The second differential output terminal AMP_$_{OM}$ 215 is connected as input to a minus latch half 222. In one example, a sensing stage 223 includes the combination of the plus latch half 221 and the minus latch half 222. For example, a differential input pair formed by a plus transistor Tp 231 and a minus transistor Tm 232 senses the differential input voltage (AMP_$_{OP}$–AMP_$_{OM}$) when an input clock CLK 240 is high. In addition, the current across plus transistor Tp 231 is denoted as Im and the current across minus transistor Tm 232 is denoted as Ip.

In one example, an offset current $I_{os}$ flows through either a set of offset transistors Top0, Top1, . . . TopN on the left side or another set of offset transistors Tom0, Tom1, . . . TomN on the right side depending on the plus or minus voltage calibration offsets. In one example, each offset transistor carries the offset current $I_{os}$ when the transistor is turned on. In one example, the offset current $I_{os}$ may be varied by enabling or disabling each of the offset transistors with voltage calibration offsets. For example, the voltage calibration offsets may include plus voltage calibration offsets and minus voltage calibration offsets. For example, the plus latch half 221 may include plus voltage calibration offsets calp<0>, calp<1>, . . . calp<n> applied to gates of the transistors within the plus latch half 221. For example, the minus latch half 222 may include minus voltage calibration offsets caln<0>, caln<1>, . . . caln<n> applied to gates of the transistors within the minus latch half 222. For example, the voltage calibration offsets may be generated by a set of latch offset digital to analog converters (DACs) (not shown).

Figure 4:
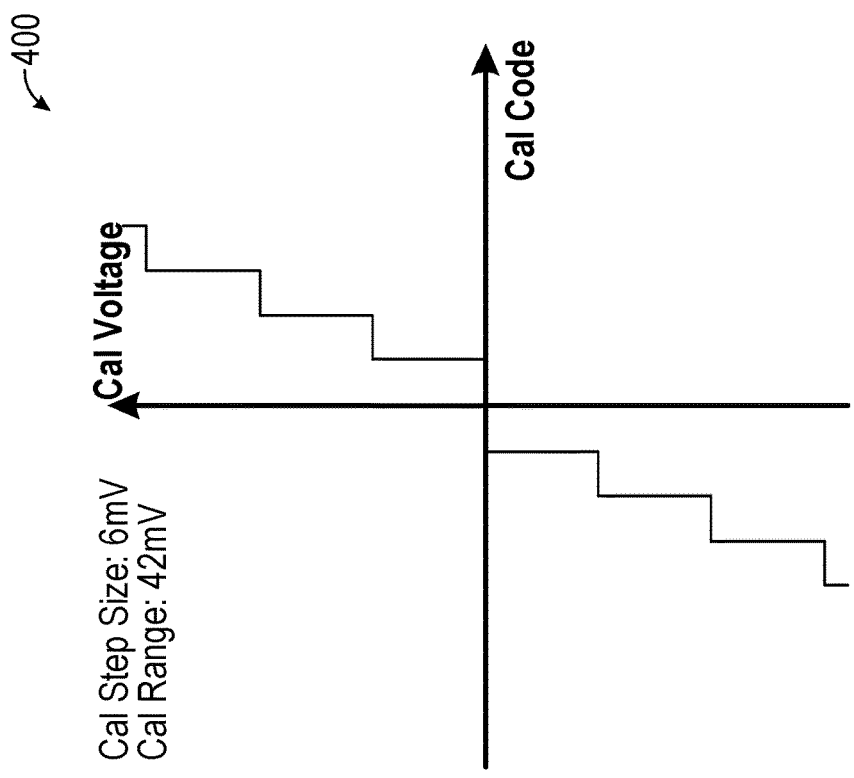
FIG. 4 illustrates an example of an offset calibration quantization graph for a transistor with 6 mV quantization step size.
Figure 3:
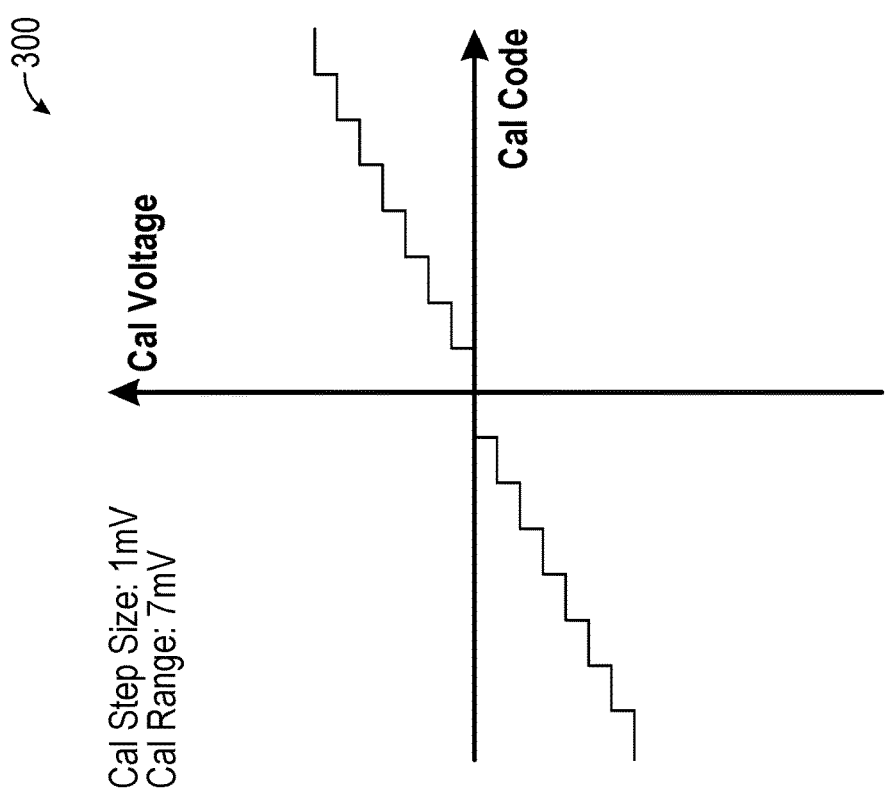
FIG. 3 illustrates an example of an offset calibration quantization graph for a transistor with 1 mV quantization step size.

In one example, the output (SAMPLE_OUT 261) of the DFE input section 100 shown in FIG. 2 may be produced by a set-reset (SR) latch 280. For example, the SR latch 280 may have a first input 251 connected to a plus latch half output OUTPA and a second input 252 connected to a minus latch half output OUTMA. In one example, the plus latch half output OUTPA and the minus latch half output OUTMA represent calibrated samples of the DFE input section 100. In another example, a quantization step size LSB($V_{os}$) of the voltage calibration offsets is proportional to a ratio of the offset current $I_{os}$ to the current Im across plus transistor Tp 231. In another example, the quantization step size LSB ($V_{os}$) of the voltage calibration offsets is proportional to a ratio of the offset transistor dimensional ratio (W/L)os to the Tp transistor dimensional ratio (W/L)tp In one example, for many types of transistor technology, for example FINFET (fin field effect transistor) technology, selection of the possible transistor dimensional ratio (W/L) may lack precise control which may result in a correspondingly poor control of the quantization step size of the voltage calibration offsets. As a result, if the quantization step size is too small, the offset calibration range may be limited. FIG. 3 illustrates an example of an offset calibration quantization graph 300 for a transistor with 1 mV quantization step size. In the example of FIG. 3, the offset calibration range is limited since the quantization step is too small. On the other hand, if the quantization step size is too large, poor offset calibration precision may result. FIG. 4 illustrates an example of an offset calibration quantization graph 400 for a transistor with 6 mV quantization step size. In the example of FIG. 4, there is a large quantization error of the offset calibration which results in poor offset calibration precision since the step size is too large.

The DFE performance depends on the sample latch precision. One aspect of the sample latch precision is the sample latch voltage offset. In one example, the sample latch voltage offset is a bias in a voltage threshold for the hard decision on the signal sample. Making the hard decision on the signal sample is deciding if the signal sample represents a 0 or a 1. And, the sample latch voltage offset should be calibrated to attain high performance of the DFE.

Figure 5:
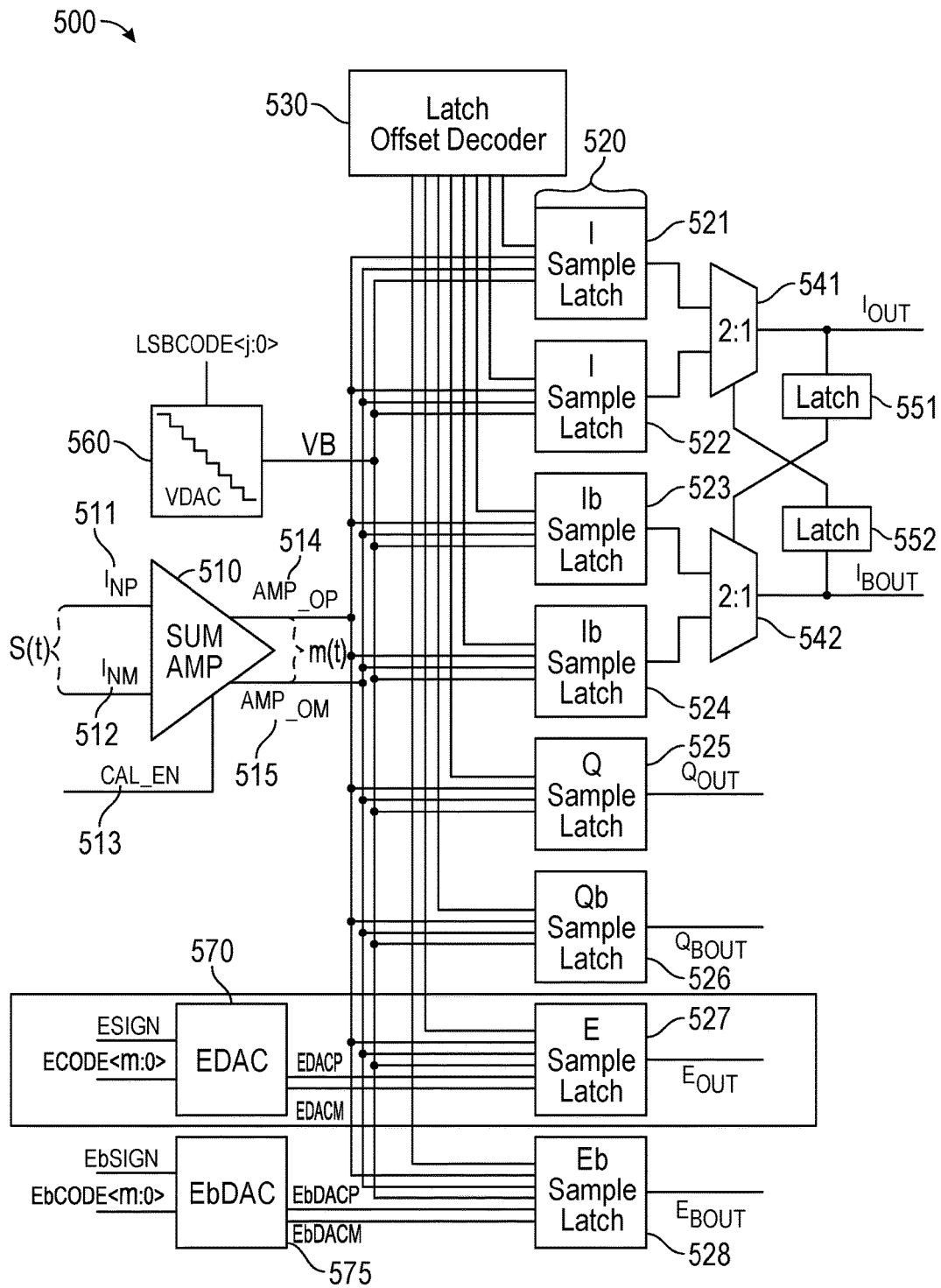
FIG. 5 illustrates a second example of a Decision Feedback Equalizer (DFE) input section.

FIG. 5 illustrates a second example of a Decision Feedback Equalizer (DFE) input section 500. The DFE input section 500 includes two calibration loops to improve DFE calibration accuracy: a latch voltage offset calibration loop and a latch quantization step size calibration loop.

The DFE input section 500 is coupled to other parts of the DFE (not shown) including tapped delay lines with adaptive weights. In one example, the DFE input section 500 accepts an analog input waveform S(t) as a function of time t and produces inphase signal samples $I_{out}$ and quadrature signal samples $Q_{out}$. The inphase and quadrature signal samples are digital representations of the analog input waveform S(t). In one example, the plurality of the signal samples a ($I_{out}$, $Q_{out}$, $I_{bout}$, $Q_{bout}$) are used to control the DFE adaptive weights. In addition, the DFE input section 500 produces target signal samples $E_{out}$ and complementary target signal samples $E_{bout}$.

Shown in FIG. 5 is a summing amplifier 510 which accepts the analog input waveform S(t) across its differential input terminals $I_{np}$ 511 and $I_{nm}$ 512 and which produces an amplified input waveform m(t) across its differential output terminals AMP_$_{OP}$ 514 and AMP_$_{OM}$ 515. In addition, a calibration enable signal CAL_EN 513 is fed to the summing amplifier 510 to enable or disable a calibration mode. The summing amplifier differential output terminals are each connected as a set of first and second inputs to a set of parallel sample latches 520. In this example, the set of parallel sample latches 520 includes 8 sample latches. The set of parallel sample latches 520 includes a first I sample latch 521, a second I sample latch 522, a first Ib sample latch 523, a second Ib sample latch 524, a Q sample latch 525, a Qb sample latch 526, a E sample latch 527, and a Eb sample latch 528.

The DFE input section 500 also includes a latch offset decoder 530. In one example, the latch offset decoder 530 may provide a set of third inputs to the set of parallel latches 520. In one example, the set of third inputs may provide a plurality of voltage calibration offsets to the set of parallel sample latches 520 to compensate their sample latch voltage offsets.

The inphase signal samples $I_{out}$ may be generated by selecting outputs of the first I sample latch 521 and the second I sample latch 522 using a first multiplexer 541. The complementary inphase signal samples $I_{bout}$ may be generated by selecting outputs of the first Ib sample latch 523 and the second Ib sample latch 524 using a second multiplexer 542. In one example, the selection of the first multiplexer 541 output may be governed by a latched version of the complementary inphase signal samples $I_{bout}$ produced by a second latch 552. In one example, the selection of the second multiplexer output may be governed by a latched version of the inphase signal samples $I_{out}$ produced by a first latch 551. The quadrature signal samples $Q_{out}$ may be generated by the output of the Q sample latch 525. The complementary quadrature signal samples $Q_{bout}$ may be generated by the output of the Qb sample latch 526. In addition, the target signal samples $E_{out}$ may be generated by the E sample latch 527 and the complementary target signal samples $E_{bout}$ may be generated by the Eb sample latch 528.

In one example, the DFE input section 500 shown in FIG. 5 may also include a voltage bias generator implemented, for example, by a voltage digital to analog converter (VDAC) 560. One skilled in the art would understand that although the VDAC is shown in FIG. 5 for implementing the functions of a voltage bias generator, other components which may also implement the functions of a voltage bias generator may also be used within the spirit and scope of the present disclosure. In one aspect, the input to the voltage bias generator (VDAC) is a quantization digital control word LSBCODE<j:0> with (j+1) bits. In another aspect, the output of the voltage bias generator (VDAC 560) is a bias voltage VB which is sent as a set of fourth inputs to the set of parallel latches 520. In one example, the set of fourth inputs may provide a plurality of bias voltages to the set of parallel sample latches 520 for the DFE sample latch calibration. In another example, the bias voltage VB is a converted analog signal based on the quantization digital control word LSBCODE<j:0>. In one example, the bias voltage VB adjusts the latch quantization step size.

The DFE input section 500 shown in FIG. 5 also may include a target signal generator implemented, for example, by a E sample digital to analog converter (EDAC) 570. One skilled in the art would understand that although the EDAC is shown in FIG. 5 for implementing the functions of a target signal generator, other components which may also implement the functions of a target signal generator may also be used within the spirit and scope of the present disclosure. In one aspect, a first input to the target signal generator (EDAC 570) is a E sample digital control word ECODE<m:0> with (m+1) bits. Also, a second input to the target signal generator (EDAC 570) is a E sample sign bit ESIGN. In another aspect, the outputs of the target signal generator (EDAC 570) are differential EDAC outputs EDACP and EDACM which are sent as a set of fifth and sixth inputs to the E sample latch 527. In one example, the set of fifth and sixth inputs EDACP and EDACM may provide a plurality of target voltages to the E sample latch 527 for DFE sample latch calibration. In another example, the target voltages EDACP and EDACM are converted analog signals based on the E sample digital control word ECODE<m:0>.

The DFE input section 500 shown in FIG. 5 also may include a complementary target signal generator implemented, for example, by a Eb sample digital to analog converter (EbDAC) 575. In one aspect, a first input to the complementary target signal generator (EbDAC 575) is a complementary E sample digital control word EbCODE<m:0> with (m+1) bits. Also, a second input to the complementary target signal generator (EbDAC 575) is a Eb sample sign bit EbSIGN. In another aspect, the outputs of the complementary target signal generator (EbDAC 575) are differential EbDAC outputs EbDACP and EbDACN which are sent as a set of fifth and sixth inputs to the Eb sample latch 528. In one example, the set of fifth and sixth inputs EbDACP and EbDACN may provide a plurality of complementary target voltages to the Eb sample latch 528 for DFE sample latch calibration. In another example, the complementary target voltages EbDACP and EbDACN are converted analog signals based on the complementary E sample digital control word EbCODE<m:0>.

In one example, the latch voltage offset calibration loop is formed by the summing amplifier 510 (enabled in calibration mode), the latch offset decoder 530 and the set of parallel latches 520. In one example, each latch may include an internal latch offset calibration voltage generator. The latch quantization step size calibration loop may employ the EDAC 570 connected to the E sample latch 527 to set a target voltage for the latch quantization step size. In one example, the latch quantization step size calibration loop may calibrate the latch quantization step size against the target voltage by varying LSBCODE<j:0>.

Figure 6:
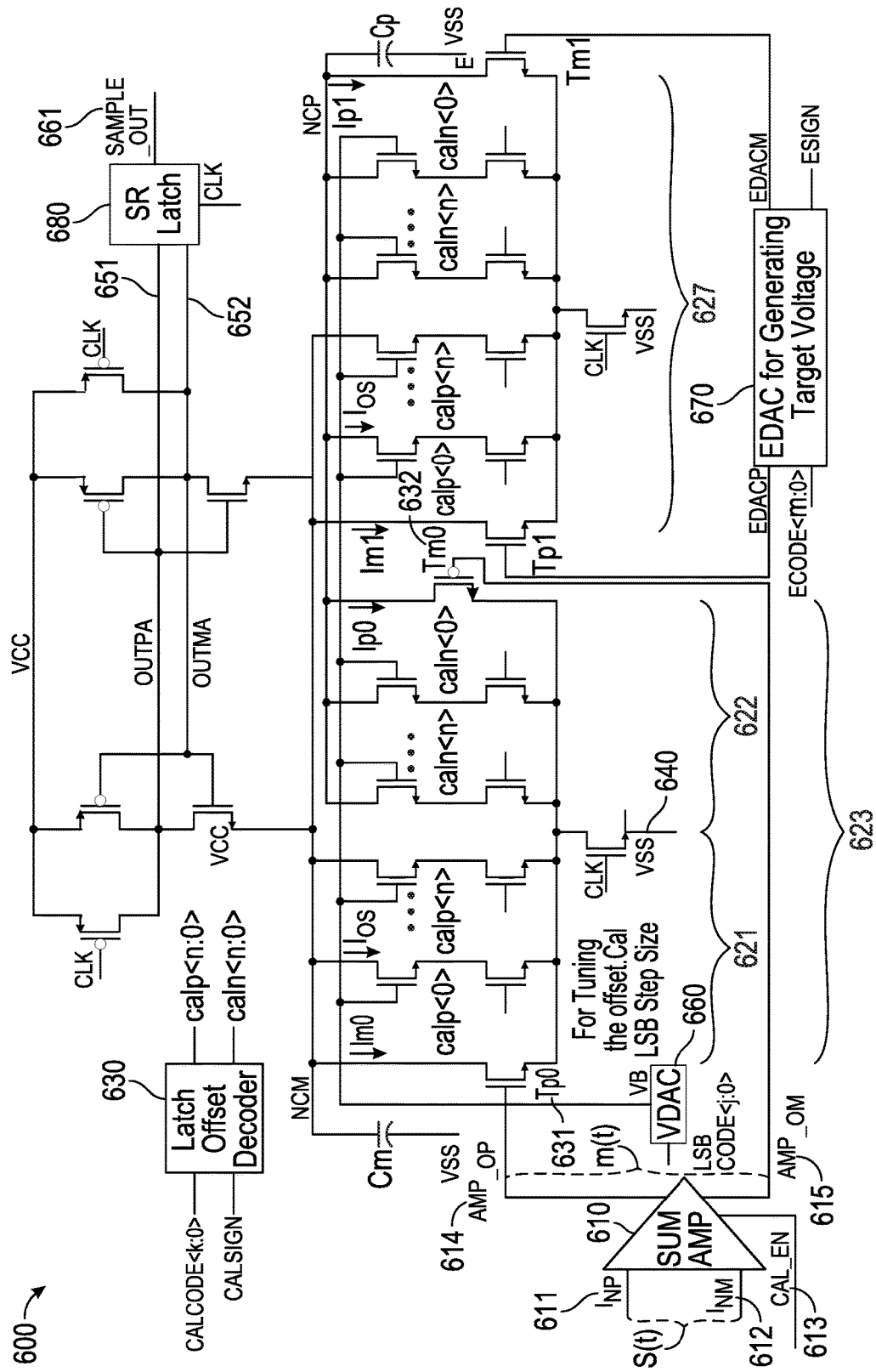
FIG. 6 illustrates a second example of an implementation 600 of the Decision Feedback Equalizer (DFE) input section 500 of FIG. 5.

FIG. 6 illustrates a second example of an implementation 600 of the Decision Feedback Equalizer (DFE) input section 500 of FIG. 5. The DFE input section 500 includes a summing amplifier (SUM AMP) 610 which accepts the analog input waveform S(t) across its differential input terminals $I_{np}$ 611 and $I_{nm}$ 612 and which produces an amplified input waveform m(t) across its first differential output terminal AMP_$_{OP}$ 614 and second differential output terminal AMP_$_{OM}$ 615. In addition, a calibration enable signal CAL_EN 613 is fed to the summing amplifier 610 to enable or disable a calibration mode. The first differential output terminal AMP_$_{OP}$ 614 is connected as an input to a plus latch half 621. The second differential output terminal AMP_$_{OM}$ 615 is connected as an input to a minus latch half 622. In one example, a sensing stage 623 includes the combination of the plus latch half 621 and the minus latch half 622. For example, a differential input pair formed by a plus transistor Tp0 631 and a minus transistor Tm0 632 senses the differential input voltage (AMP_$_{OP}$–AMP_$_{OM}$) when an input clock CLK 640 is high. In addition, the current across plus transistor Tp0 631 is denoted as Im0 and the current across minus transistor Tm0 632 is denoted as Ip0.

Also, in one example, an offset current $I_{os}$ flows through lower offset transistors Top0, Top1, . . . TopN, Tom0, Tom1, . . . TomN. In one example, the offset current $I_{os}$ may be varied by enabling or disabling each of the lower offset transistors with voltage calibration offsets. For example, the voltage calibration offsets may include plus voltage calibration offsets and minus voltage calibration offsets. For example, the plus latch half 621 may include plus voltage calibration offsets calp<0>, calp<1>, . . . calp<n> applied to gates of lower offset transistors within the plus latch half 621. For example, the minus latch half 622 may include minus voltage calibration offsets caln<0>, caln<1>, . . . caln<n> applied to gates of lower offset transistors within the minus latch half 622. For example, the voltage calibration offsets may be generated by a latch offset decoder 630.

In one example, the output (SAMPLE_OUT 661) of the DFE input section 500 shown in FIG. 6 may be produced by a set-reset (SR) latch 680. For example, the SR latch 680 may have a first input 651 connected to a plus latch half output OUTPA and a second input 652 connected to a minus latch half output OUTMA. In one example, the plus latch half output OUTPA and the minus latch half output OUTMA represent calibrated samples of the DFE input section 500.

In one example, FIG. 6 may also include a voltage bias generator implemented, for example, by a voltage digital to analog converter (VDAC) 660. One skilled in the art would understand that although the VDAC is shown in FIG. 6 for implementing the functions of a voltage bias generator, other components which may also implement the functions of a voltage bias generator may also be used within the spirit and scope of the present disclosure. In one aspect, the input to the voltage bias generator (VDAC 660) is a quantization digital control word LSBCODE<j:0> with (j+1) bits. In another aspect, the output of the voltage bias generator (VDAC 660) is a bias voltage VB which is sent as a set of fourth inputs to the set of parallel sample latches 520. In one example, the set of fourth inputs may provide a plurality of bias voltages to the set of parallel sample latches 520 for DFE sample latch calibration. In another example, the bias voltage VB is a converted analog signal based on the quantization digital control word LSBCODE<j:0>. In one example, the bias voltage VB adjusts the latch quantization step size.

In one example, FIG. 6 may also include a target signal generator implemented, for example, by a E sample digital to analog converter (EDAC) 670. One skilled in the art would understand that although the EDAC is shown in FIG. 6 for implementing the functions of a target signal generator, other components which may also implement the functions of a target signal generator may also be used within the spirit and scope of the present disclosure. In one aspect, a first input to the target signal generator (EDAC 670) is a E sample digital control word ECODE<m:0> with (m+1) bits. Also, a second input to the target signal generator (EDAC 670) is a E sample sign bit ESIGN. In another aspect, the outputs of the target signal generator (EDAC 670) are differential EDAC outputs EDACP and EDACM which are sent as a set of fifth and sixth inputs to the E sample latch 627. In one example, the set of fifth and sixth inputs EDACP and EDACM may provide a plurality of target voltages to the E sample latch 627 for DFE sample latch calibration. In one example, the E sample latch 627 shown in FIG. 6 is an expanded view of the E sample latch 527 shown in FIG. 5. In another example, the target voltages EDACP and EDACM are converted analog signals based on the E sample digital control word ECODE<m:0>.

In one example, each of the set of parallel sample latches 520 includes an upper transistor and a lower transistor.

In one example, a first input pair Tp0/Tm0 of a sensing stage 623 (shown inn FIG. 6) of an I sample latch may be connected to an output of the summing amplifier 610 with a calibration enable signal CAL_EN used to enable a calibration mode. In one example, when the calibration mode is enabled with CAL_EN=1, the differential input signals of the summing amplifier 610 may be blocked. Also, when the calibration mode is enabled, the outputs of the summing amplifier 610, AMP_$_{OP}$ 614 and AMP_$_{OM}$ 615 may be in a zero differential mode and set to a summing amplifier common mode voltage level ($V_{cm\_sum}$) such that $AMP\_{OP}=AMP\_{OM}=V_{cm\_sum}$.

In another example, a second input pair Tp1/Tm1 of the sensing stage 623 of an E sample latch may be connected to a EDAC output, EDACP and EDACM. In one example, the EDAC differential output voltage, v(EDACP)–v(EDACM), may be adjusted precisely by the E sample digital control word ECODE<m:0> and ESIGN. For example, the differential output voltage of the EDAC may be used as a target or ruler to measure the offset calibration voltage Vos injected into the sensing stage of the sample latch and to measure and calibrate the offset calibration step size (LSB_Vos).

In another example, the EDAC 670 is a high precision voltage digital to analog converter. The EDAC differential output voltage, v(EDACP)–v(EDACM), may be adjusted with high voltage precision, for example, 2 mV. In another example, the EDAC common mode voltage, VCM_EDAC may be set to be the same as the summing amplifier common mode voltage, $V_{cm\_sum}$, by a common mode (CM) feedback loop.

Figure 7:
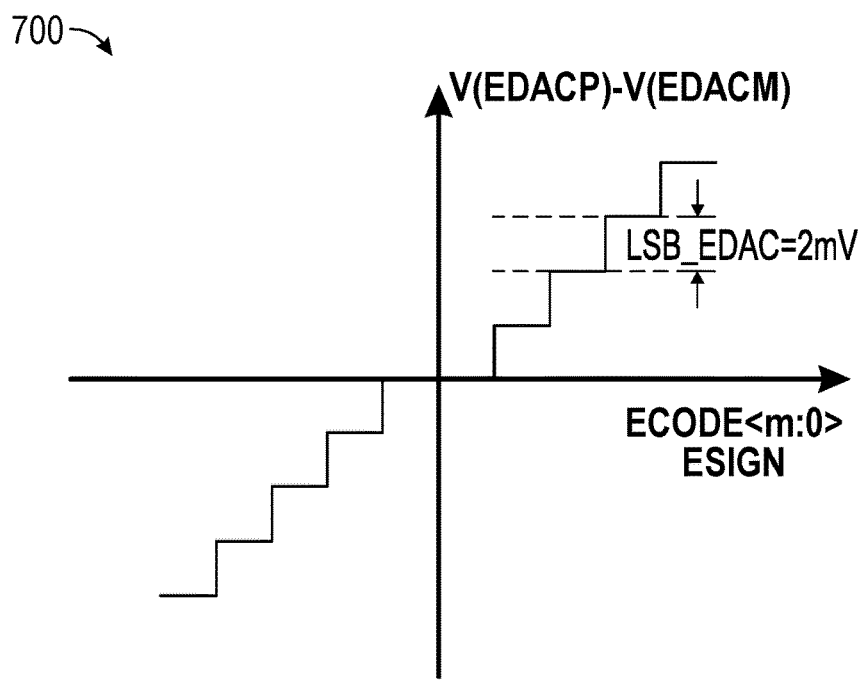
FIG. 7 illustrates an example of a digital to analog converter (DAC) transfer function for a E sample digital to analog converter (EDAC).

FIG. 7 illustrates an example of a digital to analog converter (DAC) transfer function 700 for a E sample digital to analog converter (EDAC). In one example, the horizontal axis is a domain of the E sample digital control word ECODE<m:0> and the E sample sign bit ESIGN. The vertical axis is a range of the EDAC differential output voltage, v(EDACP)–v(EDACM). In addition, a EDAC output resolution is labeled as LSB_EDAC. In the example shown in FIG. 7, LSB_EDAC=2 mV. For example, the relationship between the EDAC differential output voltage v(EDACP)–v(EDACM) and the E sample digital control word ECODE<m:0> may be expressed as:

$$v(EDACP)-v(EDACM)=LSB\_EDAC*ECODE<m:0>.$$

That is, the EDAC differential output voltage v(EDACP)–v(EDACM) is a converted analog version of the E sample digital control word ECODE<m:0> scaled by the EDAC output resolution LSB_EDAC. In one example, the DAC transfer function 700 represents the transfer function for the EDAC 670 (shown in FIG. 6), where the EDAC differential output voltage, v(EDACP)–v(EDACM), is a function of ECODE.

Figure 8:
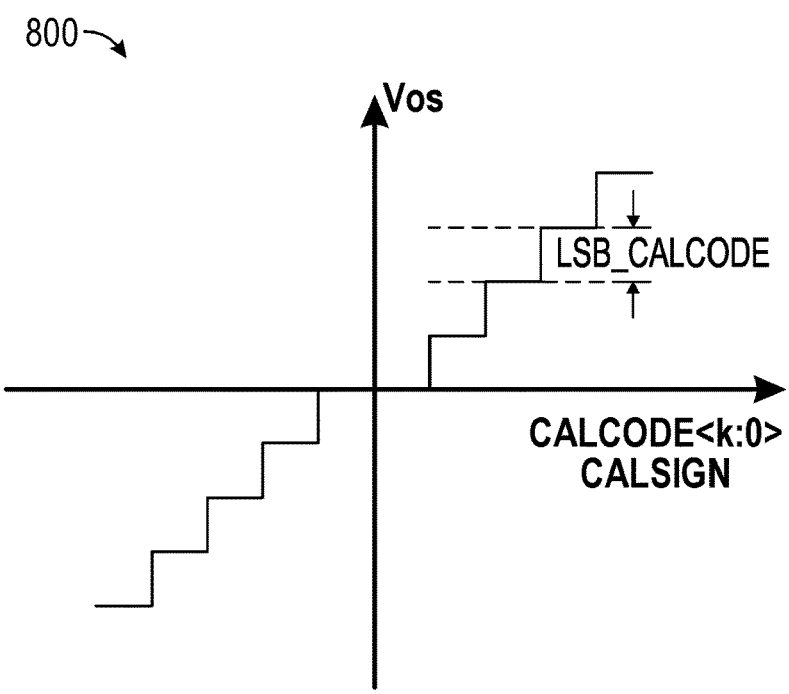
FIG. 8 illustrates an example of a digital to analog converter (DAC) transfer function for a latch offset decoder.

FIG. 8 illustrates an example of a digital to analog converter (DAC) transfer function 800 for a latch offset decoder. In one example, the horizontal axis is a domain of a calibration digital control word CALCODE<k:0> and a calibration sample sign bit CALSIGN. The vertical axis is a range of the offset calibration voltage, Vos. In addition, a latch offset decoder resolution is labeled as LSB_CALCODE. In one example, LSB_CALCODE=$I_{os}$/G, where G is an effective conductance of the offset transistors of the plus latch half 221 and the minus latch half 222. For example, the relationship between the offset calibration voltage Vos and calibration digital control word CALCODE<k:0> may be expressed as:

$$Vos=LSB\_CALCODE*CALCODE<k:0>.$$

That is, the offset calibration voltage Vos is a converted analog version of the calibration digital control word CALCODE<k:0> scaled by the latch offset decoder resolution LSB_CALCODE. In one example, the DAC transfer function 800 represents the transfer function for the latch offset decoder 630 (shown in FIG. 6), where the latch offset decoder outputs (plus voltage calibration offsets calp<.> and minus voltage calibration offsets caln<.>) are each equal to the offset calibration voltage Vos.

Figure 9:
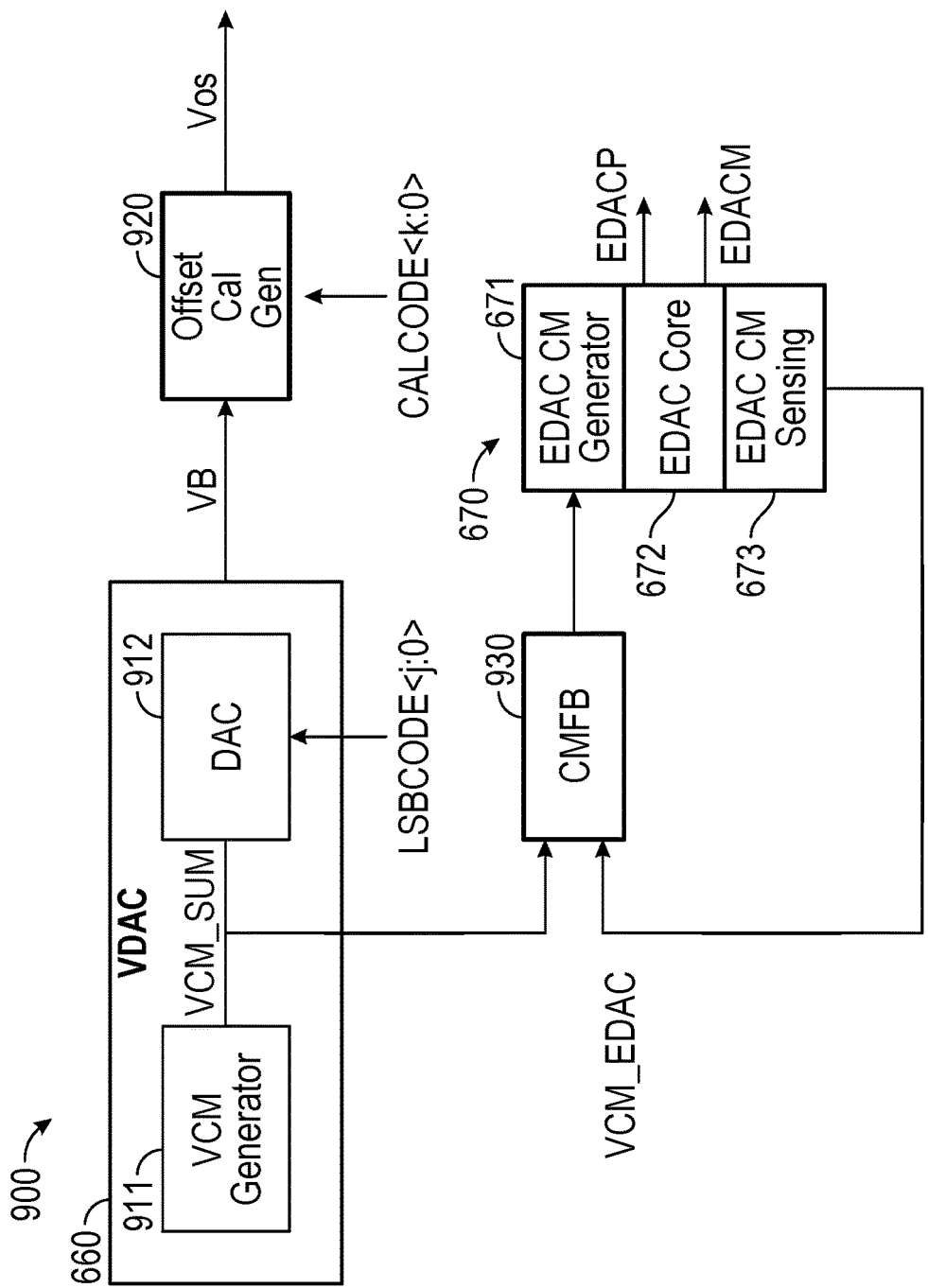
FIG. 9 illustrates an example of a common mode feedback (CMFB) loop.

FIG. 9 illustrates an example of a common mode feedback (CMFB) loop 900. The CMFB loop may be used to ensure that the EDAC common mode level, VCM_EDAC, is the same as the summing amplifier common mode level, VCM_SUM. For example, the bias voltage VB is generated by the voltage bias generator implemented, for example, by the voltage digital to analog converter (VDAC) 660. One skilled in the art would understand that although the VDAC is shown in FIG. 6 for implementing the functions of a voltage bias generator, other components which may also implement the functions of a voltage bias generator may also be used within the spirit and scope of the present disclosure. As an example, the VDAC 660 includes common mode voltage (VCM) generator 911 and a digital to analog converter (DAC) 912 In one example, the summing amplifier common mode level, VCM_SUM may be generated by the common mode voltage (VCM) generator 911. In one example, the VDAC 660 may be controlled by a quantization digital control word LSBCODE<j:0>. The bias voltage VB may be generated by a superposition of the summing amplifier common model level, VCM_SUM, and a converted analog voltage level dV*LSBCODE<j:0>, where dV is a VDAC output resolution. That is, $$VB=VCM\_SUM+dV*LSBCODE<j:0>.$$

Next, the bias voltage VB is sent to an offset calibration generator 920 which accepts the calibration digital control word CALCODE<k:0> to produce the offset calibration voltage Vos. In addition, the summing amplifier common mode level, VCM_SUM is sent as a first input to the common mode feedback (CMFB) block 930. The output of the CMFB block 930 is sent as input to the EDAC 670, in particular, to a EDAC common mode (CM) generator 671. The output of the EDAC 670 is the EDAC differential output voltage, v(EDACP)–v(EDACM) from the EDAC core 672. In addition, a EDAC common mode (CM) sensing block 673 provides the EDAC common mode (CM) level, VCM_EDAC, as a second input to the CMFB block 930.

Figure 10:
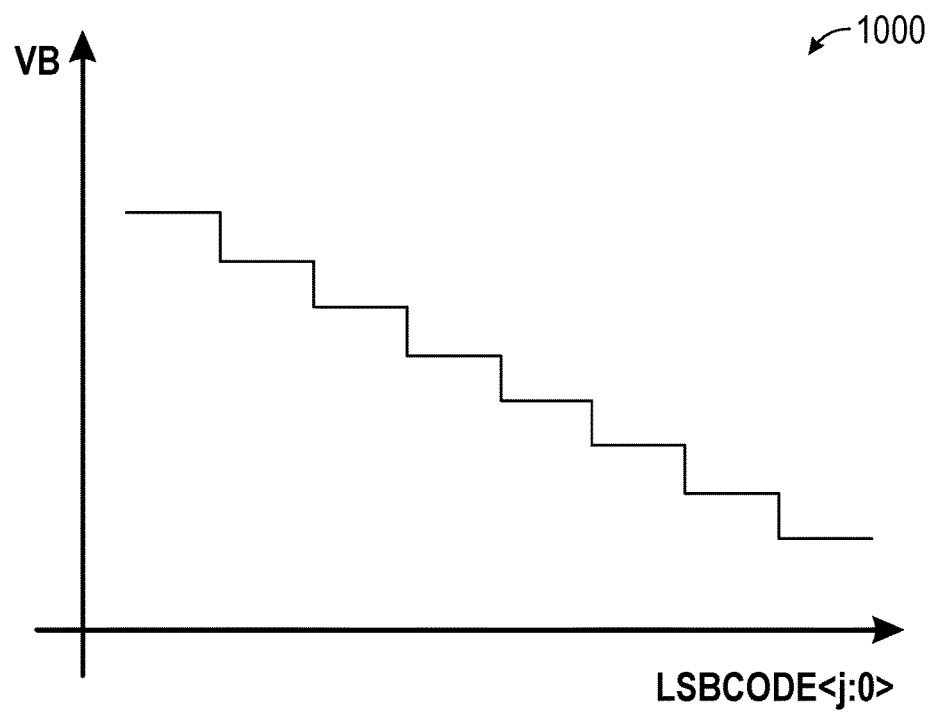
FIG. 10 illustrates an example of a digital to analog converter (DAC) transfer function for a voltage digital to analog converter (VDAC).

FIG. 10 illustrates an example of a digital to analog converter (DAC) transfer function 1000 for a voltage digital to analog converter (VDAC). In one example, the horizontal axis is a domain of the quantization digital control word LSBCODE<j:0>. The vertical axis is a range of the bias voltage VB. In addition, the VDAC output resolution is dV. For example, the relationship between the bias voltage VB and the quantization digital control word LSBCODE<j:0> may be expressed as:

$$VB=VCM\_SUM+dV*LSBCODE<j:0>.$$

That is, the bias voltage VB is a converted analog version of the quantization digital control word LSBCODE<j:0> scaled by the VDAC output resolution dV.

Figure 11:
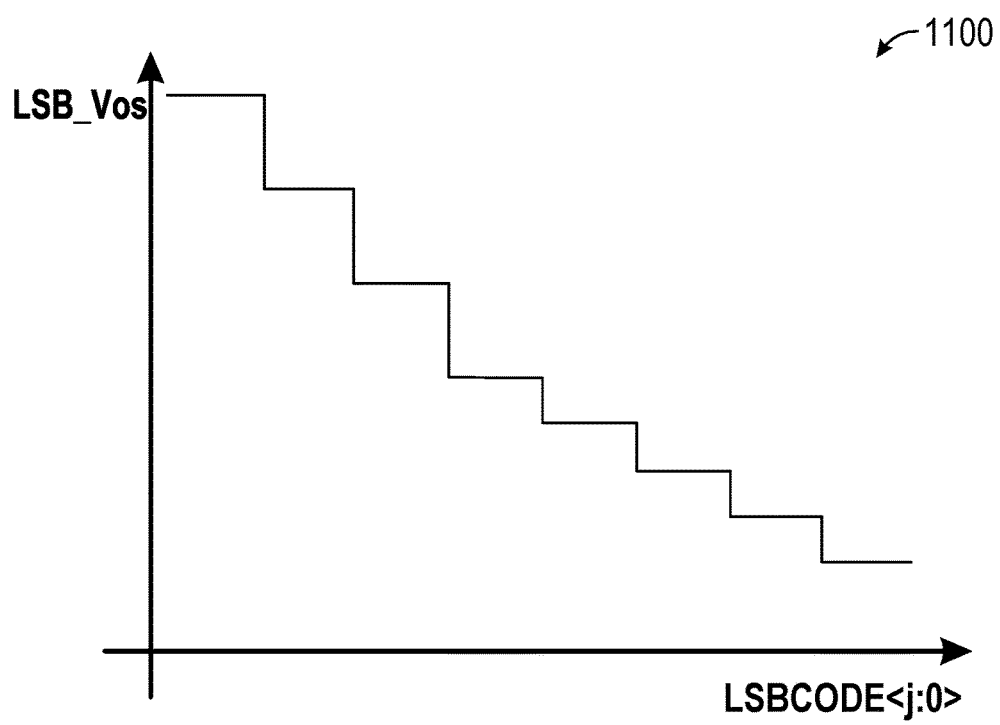
FIG. 11 illustrates an example of a transfer function for the VDAC from a quantization digital control word LSBCODE<j:0> to an offset calibration step size LSB_Vos.

FIG. 11 illustrates an example of a transfer function 1100 for the VDAC from a quantization digital control word LSBCODE<j:0> to an offset calibration step size LSB_Vos. In one example, LSB_Vos may be a monotonic function of the bias voltage VB and the bias voltage VB may be a linearly dependent function of the quantization digital control word LSBCODE<j:0>. In one example, the equation for the offset calibration step size LSB_Vos may be expressed as $$LSB\_Vos=f(VB)=f(VCM\_SUM+dV*LSBCODE<j:0>),$$

where f(·) denotes a monotonic function. In one example, the offset calibration step size LSB_Vos, may be tuned in a fine granular scale with the quantization digital control word LSBCODE<j:0>.

In one example, a calibration process for the offset calibration step size LSB_Vos may be defined as follows:
1. Establish an offset calibration voltage Vos as a monotonic function of a quantization digital control word LSBCODE, where Vos=LSB_Vos*CALCODE=f(VC-M_SUM+dV*LSBCODE)*CALCODE.
2. Set a target EDAC differential output voltage [v(EDACP)−v(EDACM)]_tgt with a E sample digital control word ECODE, where [v(EDACP)−v(EDACM)]_tgt=LSB_EDAC*ECODE and LSB_EDAC is a known EDAC step size.
3. Force offset calibration voltage Vos to equal the target EDAC differential output voltage [(v(EDACP)−v(EDACM)]_tgt by adjusting the quantization digital control word LSBCODE according to the monotonic function f(·).
4. Derive the offset calibration step size LSB_Vos from the adjusted quantization digital control word LSBCODE by equating two equations and solving for the offset calibration step size LSB_Vos via a step size calibration equation:

$$LSB\_Vos=(LSB\_EDAC*ECODE)/CALCODE$$

Figure 12:
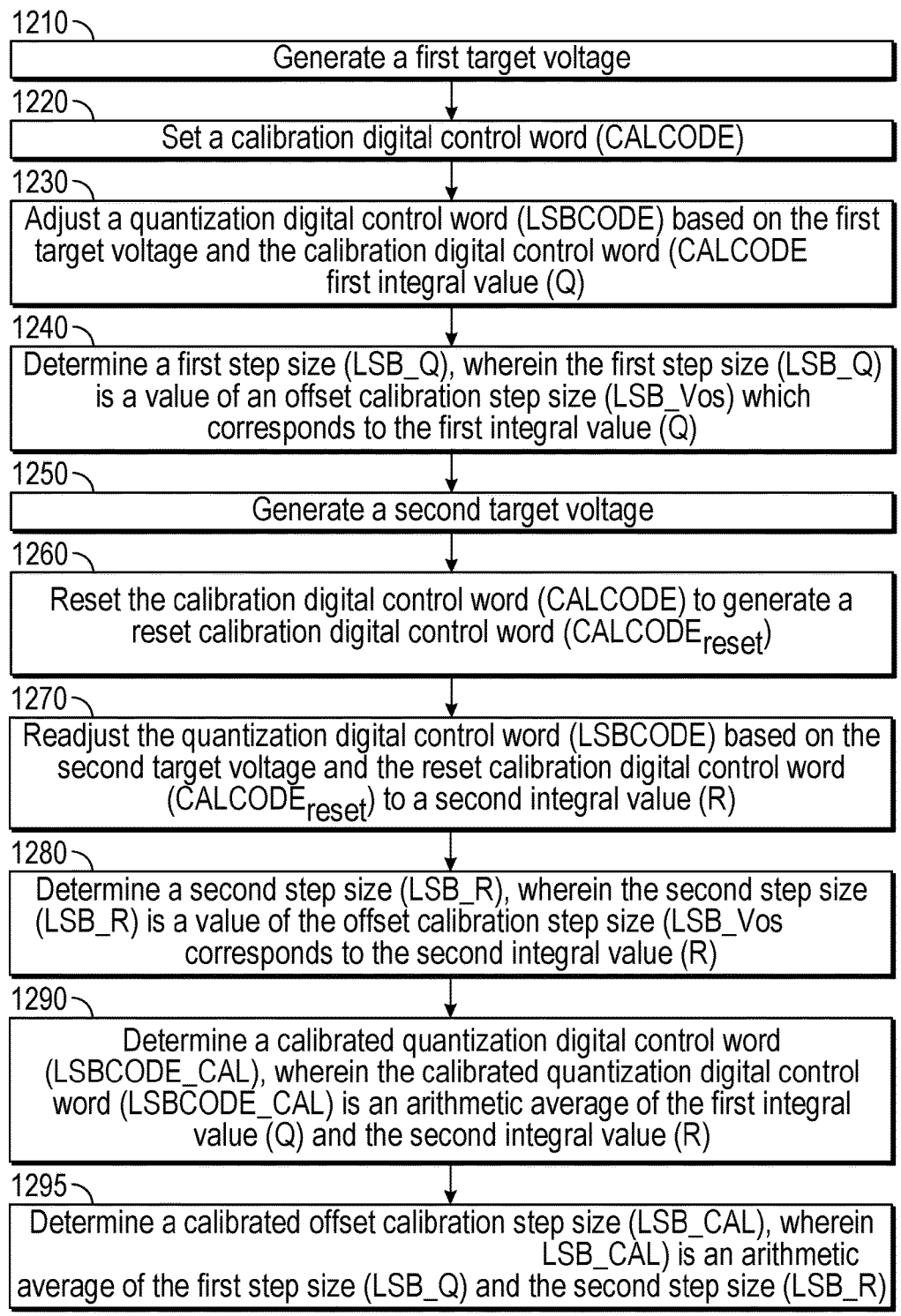
FIG. 12 illustrates an example flow diagram for determining an offset calibration step size of a sample latch.

FIG. 12 illustrates an example flow diagram 1200 for determining an offset calibration step size of a sample latch. To eliminate influence of a possible offset voltage in a E sample latch, the calibration process is performed twice with opposite polarity.

In block 1210, generate a first target voltage. In one example, the first target voltage is generated by setting a E sample digital control word (ECODE) to a first target code with a E sample sign bit (ESIGN) set to a first polarity. The E sample sign bit (ESIGN) is the polarity value of the E sample digital control word (ECODE). The first target code may be a predefined number which is set, for example, based on one or more of the following: a particular application or a design requirement. In one example, the first target voltage may equal a product of the first target code and a known EDAC output resolution (LSB_EDAC). In one example, the EDAC output resolution (LSB_EDAC) is previously calibrated or is set by a specification sheet of the EDAC.

In block 1220, set a calibration digital control word (CALCODE). In one example, the calibration digital control word (CALCODE) is set to a second target code with a calibration sign bit (CALSIGN) set to a second polarity. The calibration sign bit (CALSIGN) is the polarity value of the calibration digital control word (CALCODE). The second target code may be a predefined number which is set, for example, based on one or more of the following: a particular application or a design requirement. In one example, the second target code is different from the first target code.

In block 1230, adjust a quantization digital control word (LSBCODE) based on the first target voltage and the calibration digital control word (CALCODE) to a first integral value (Q). The first integral value (Q) is based on the sample latch reaching a first metastable state. In one aspect, a metastable state is defined as an unstable equilibrium between two stable states of the sample latch.

In block 1240, determine a first step size (LSB_Q), wherein the first step size (LSB_Q) is a value of an offset calibration step size (LSB_Vos) which corresponds to the first integral value (Q).

In block 1250, generate a second target voltage. In one example, the second target voltage is generated by setting the E sample digital control word (ECODE) to a third target code with the E sample sign bit (ESIGN) set to a third polarity. The third target code may be a predefined number which is set, for example, based on one or more of the following: a particular application or a design requirement. In one example, the second target voltage is equal to the third target code and the known EDAC output resolution (LSB_EDAC).

In block 1260, reset the calibration digital control word (CALCODE) to generate a reset calibration digital control word (CALCODE$_{reset}$). In one example, the calibration digital control word (CALCODE) is reset to a fourth target code with the calibration sign bit (CALSIGN) reset to a fourth polarity. The fourth target code may be a predefined number which is set, for example, based on one or more of the following: a particular application or a design requirement.

In block 1270, readjust the quantization digital control word (LSBCODE) based on the second target voltage and the reset calibration digital control word (CALCODE$_{reset}$) to a second integral value (R). The second integral value (R) is based on the sample latch reaching a second metastable state. In one example, the second metastable state is different from the first metastable state.

In block 1280, determine a second step size (LSB_R), wherein the second step size (LSB_R) is a value of the offset calibration step size (LSB_Vos) which corresponds to the second integral value (R).

In block 1290, determine a calibrated quantization digital control word (LSBCODE_CAL), wherein the calibrated quantization digital control word (LSBCODE_CAL) is an arithmetic average of the first integral value (Q) and the second integral value (R). That is, LSBCODE_CAL=(Q+R)/2. The calibrated quantization digital control word (LSBCODE_CAL) is the calibrated value of the quantization digital control word (LSBCODE) based on the first integral value (Q) and the second integral value (R).

In block 1295, determine a calibrated offset calibration step size (LSB_CAL), wherein the calibrated offset calibration step size (LSB_CAL) is an arithmetic average of the first step size (LSB_Q) and the second step size (LSB_R). That is, LSB_CAL=(LSB_Q+LSB_R)/2. In one example, the determining the calibrated offset calibration step size (LSB_CAL) is based on setting the quantization digital control word (LSBCODE) as calibrated quantization digital control word (LSBCODE_CAL). The calibrated offset calibration step size (LSB_CAL) is the calibrated value of the offset calibration step size (LSB_Vos).

As an example, the determination of the offset calibration step size (LSB_Vos) may be illustrated by a numeric example. In one example, the first target voltage is −30 mV, the first target code is 15 and the first polarity is NEGATIVE. In one example, the second target code is 10 and the second polarity is POSITIVE. And, the second target voltage is +30 mV, the third target code is 15 and the third polarity is POSITIVE. In one example, the fourth target code is 10 and the fourth polarity is NEGATIVE. And, based on the example numerical values, the calibrated offset calibration step size (LSB_CAL) equals 3 mV.

In one aspect, one or more of the steps for determining an offset calibration step size of a sample latch in FIG. 12 may be executed by one or more processors which may include hardware, software, firmware, etc. In one aspect, one or more of the steps in FIG. 12 may be executed by one or more processors which may include hardware, software, firmware, etc. The one or more processors, for example, may be used to execute software or firmware needed to perform the steps in the flow diagram of FIG. 12. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium. The computer-readable medium may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium may reside in the processing system, external to the processing system, or distributed across multiple entities including the processing system. The computer-readable medium may be embodied in a computer program product. By way of example, a computer program product may include a computer-readable medium in packaging materials. The computer-readable medium may include software or firmware for determining an offset calibration step size of a sample latch. Those skilled in the art will recognize how best to implement the described functionality presented throughout this disclosure depending on the particular application and the overall design constraints imposed on the overall system.

Any circuitry included in the processor(s) is merely provided as an example, and other means for carrying out the described functions may be included within various aspects of the present disclosure, including but not limited to the instructions stored in the computer-readable medium, or any other suitable apparatus or means described herein, and utilizing, for example, the processes and/or algorithms described herein in relation to the example flow diagram.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first die may be coupled to a second die in a package even though the first die is never directly physically in contact with the second die. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

What is claimed is:

1. A method for determining an offset calibration step size of a sample latch, the method comprising:
    generating a first target voltage;
    setting a calibration digital control word; and
    adjusting a quantization digital control word based on the first target voltage and the calibration digital control word to a first integral value, wherein the first integral value is based on the sample latch reaching a first metastable state.

2. The method of claim 1, further comprising determining a first step size, wherein the first step size is a value of an offset calibration step size which corresponds to the first integral value.

3. The method of claim 2, further comprising:
    generating a second target voltage;
    resetting the calibration digital control word to generate a reset calibration digital control word; and readjusting the quantization digital control word based on the second target voltage and the reset calibration digital control word to a second integral value.

4. The method of claim 3, further comprising determining a second step size, wherein the second step size is a value of the offset calibration step size which corresponds to the second integral value.

5. The method of claim 4, further comprising determining a calibrated quantization digital control word, wherein the calibrated quantization digital control word is an arithmetic average of the first integral value and the second integral value.

6. The method of claim 5, further comprising determining a calibrated offset calibration step size, wherein the calibrated offset calibration step size is an arithmetic average of the first step size and the second step size.

7. The method of claim 3, wherein the second integral value is based on the sample latch reaching a second metastable state.

8. The method of claim 7, wherein the second metastable state is different from the first metastable state.

9. The method of claim 1, wherein generating the first target voltage comprises setting a E sample digital control word to a first target code with a E sample sign bit set to a first polarity.

10. The method of claim 9, wherein the first target voltage equals a product of the first target code and a E sample digital to analog converter (EDAC) output resolution.

11. A Decision Feedback Equalizer (DFE) input section comprising:
- a E sample latch to output a target signal sample;
- a E sample digital to analog converter coupled to the E sample latch to input a target voltage to the E sample latch;
- a sample latch to output a signal sample; and
- a voltage digital to analog converter coupled to the E sample latch and the sample latch to generate a bias voltage, wherein the bias voltage is inputted to the E sample latch and the sample latch.

12. The Decision Feedback Equalizer input section of claim 11, further comprising a latch offset decoder to scale the bias voltage.

13. The Decision Feedback Equalizer input section of claim 12, further comprising a summing amplifier to receive an analog input waveform S(t) to the DFE input section.

14. The Decision Feedback Equalizer input section of claim 11, wherein the signal sample and the target signal sample are compared to determine if a metastable state is reached by the sample latch.

15. The Decision Feedback Equalizer input section of claim 11, further comprising a Eb sample latch to output a complementary target signal sample.

16. The Decision Feedback Equalizer input section of claim 15, wherein the sample latch comprises a plurality of sample latches, and wherein the signal sample comprises at least an inphase signal sample and a quadrature signal sample.

17. The Decision Feedback Equalizer input section of claim 16, wherein the plurality of sample latches further outputs at least a complementary inphase signal sample and a complementary quadrature signal sample.

18. The Decision Feedback Equalizer input section of claim 17, wherein a first combination of the target signal sample and the complementary target signal sample is compared with a second combination of the at least the inphase signal sample and the quadrature signal sample and the at least the complementary inphase signal sample and the complementary quadrature signal sample to determine if a metastable state is reached by the sample latch.

19. A Decision Feedback Equalizer (DFE) input section comprising:
- means for outputting a target signal sample;
- means for inputting a target voltage to the means for outputting the target signal sample;
- means for outputting a signal sample; and
- means for generating a bias voltage, wherein the bias voltage is inputted to the means for outputting the target signal sample and the means for outputting the signal sample.

20. The Decision Feedback Equalizer input section of claim 19, further comprising means for scaling the bias voltage.

21. The Decision Feedback Equalizer input section of claim 20, further comprising means for receiving an analog input waveform to the DFE input section.

22. A non-transitory computer-readable medium storing computer executable code, operable on a device comprising at least one processor and at least one memory coupled to the at least one processor, wherein the at least one processor is configured to implement determining an offset calibration step size of a sample latch, the computer executable code comprising:
- instructions for causing a computer to generate a first target voltage;
- instructions for causing the computer to set a calibration digital control word; and
- instructions for causing the computer to adjust a quantization digital control word based on the first target voltage and the calibration digital control word to a first integral value, wherein the first integral value is based on the sample latch reaching a first metastable state.

23. The non-transitory computer-readable medium of claim 22, further comprising instructions for causing the computer to determine a first step size, wherein the first step size is a value of an offset calibration step size which corresponds to the first integral value.

24. The non-transitory computer-readable medium of claim 23, further comprising
- instructions for causing the computer to generate a second target voltage;
- instructions for causing the computer to reset the calibration digital control word to generate a reset calibration digital control word; and
- instructions for causing the computer to readjust the quantization digital control word based on the second target voltage and the reset calibration digital control word to a second integral value.

25. The non-transitory computer-readable medium of claim 24, further comprising instructions for causing the computer to determine a second step size, wherein the second step size is a value of the offset calibration step size which corresponds to the second integral value.

26. The non-transitory computer-readable medium of claim 25, further comprising instructions for causing the computer to determine a calibrated quantization digital control word, wherein the calibrated quantization digital control word is an arithmetic average of the first integral value and the second integral value.

27. The non-transitory computer-readable medium of claim 26, further comprising instructions for causing the computer to determine a calibrated offset calibration step size, wherein the calibrated offset calibration step size is an arithmetic average of the first step size and the second step size.

28. The non-transitory computer-readable medium of claim 24, wherein the second integral value is based on the sample latch reaching a second metastable state, and wherein the second metastable state is different from the first metastable state.

29. The non-transitory computer-readable medium of claim 22, wherein the instructions for causing the computer to generate the first target voltage further comprises instructions for causing the computer to set a E sample digital control word to a first target code with a E sample sign bit set to a first polarity.

30. The non-transitory computer-readable medium of claim 29, wherein the first target voltage equals a product of the first target code and a E sample digital to analog converter (EDAC) output resolution.

\* \* \* \* \*